United States Patent
Parker et al.

(10) Patent No.: US 7,466,522 B2
(45) Date of Patent: Dec. 16, 2008

(54) ELECTRICAL LEAD STRUCTURES HAVING CRYSTALLINE STRUCTURES THAT MATCH UNDERLYING MAGNETIC HARD BIAS LAYERS FOR MAGNETORESISTIVE SENSORS

(75) Inventors: Michael Andrew Parker, Fremont, CA (US); Mustafa Michael Pinarbasi, Morgan Hill, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 343 days.

(21) Appl. No.: 11/363,435

(22) Filed: Feb. 27, 2006

(65) Prior Publication Data

US 2006/0146453 A1 Jul. 6, 2006

Related U.S. Application Data

(63) Continuation-in-part of application No. 10/631,338, filed on Jul. 30, 2003, now Pat. No. 7,088,562.

(51) Int. Cl.
G11B 5/39 (2006.01)

(52) U.S. Cl. .................. 360/322; 360/324.12
(58) Field of Classification Search .......... 360/322, 360/324.12
See application file for complete search history.

(56) References Cited

U.S. PATENT DOCUMENTS

| 4,639,806 | A | 1/1987 | Kira et al. ............ 360/327.32 |
| 5,993,956 | A | 11/1999 | Lambeth et al. ............. 428/332 |
| 6,077,603 | A | 6/2000 | Zhang ....................... 428/332 |
| 6,185,081 | B1 | 2/2001 | Simion et al. ............ 360/327.3 |
| 6,219,207 | B1 | 4/2001 | Pinarbasi .................. 360/322 |
| 6,417,999 | B1 | 7/2002 | Knapp et al. ............... 360/322 |
| 6,632,474 | B1 | 10/2003 | Horng et al. ............... 427/131 |
| 6,853,519 | B2 * | 2/2005 | Parker et al. ............... 360/322 |
| 2001/0033949 | A1 | 10/2001 | Abarra et al. ............... 428/831 |
| 2002/0186516 | A1 * | 12/2002 | Larson et al. .......... 360/324.12 |
| 2006/0028775 | A1 * | 2/2006 | Yamashita et al. ..... 360/324.12 |

OTHER PUBLICATIONS

Muller, Stefan, "Bulk and Surface Ordering Phenomena in Binary Metal Alloys", J. Phys. Condens, Matter v. 15 (2003) pp. 1429-1430 and 1478.

Schirmer, B., "Exploring the limits of functional modification of thin magnetic films", Forschungszentrum Julich (Hannover, Germany; TIB Hannover) Mar. 1999.

* cited by examiner

Primary Examiner—Julie Anne Watko
(74) Attorney, Agent, or Firm—Robert O. Guillot; Intellectual Property Law Offices

(57) ABSTRACT

A magnetic head including an electrical lead layer that is comprised of a material having an ordered-phase crystalline structure. In a preferred embodiment, the ordered-phase crystalline structure of the electrical lead is epitaxially matched to the crystalline structure of the hard bias layer upon which it is formed, and there is no need for a seed layer for the electrical leads. Electrical leads comprised of the materials used in the invention having an ordered-phase crystalline structure, particularly a B2, $L1_0$, $L1_1$, and $L1_2$ structure, will have significantly reduced resistivity over the prior art electrical leads that are typically composed of rhodium or tantalum. As a result, thinner electrical leads can be fabricated which carry the same, or even greater, current than the prior art rhodium or tantalum leads. The preferred leads are comprised of NiAl, FeCo, or CuZn having a B2 crystalline structure, and alternative embodiments are comprised of CuAu, $Cu_3Au$, CuPt, and $Cu_3Pt$.

14 Claims, 2 Drawing Sheets

ELECTRICAL LEAD STRUCTURES HAVING CRYSTALLINE STRUCTURES THAT MATCH UNDERLYING MAGNETIC HARD BIAS LAYERS FOR MAGNETORESISTIVE SENSORS

CROSS-REFERENCE TO RELATED APPLICATION

This application is a continuation-in-part of patent application Ser. No. 10/631,338 filed Jul. 30, 2003 now U.S. Pat. No. 7,088,562.

BACKGROUND OF THE INVENTION

1. Field of the Invention

The present invention relates generally to magnetoresistive (MR and GMR) sensors for read head portions of magnetic heads for hard disk drives, and more particularly to electrical leads for conducting current to such MR and GMR sensors.

2. Description of the Prior Art

In commonly used magnetoresistive (MR) and giant magnetoresistive (GMR) read head sensors an underlayer is deposited upon a wafer substrate and a first magnetic shield (S1) is fabricated upon the underlayer. A first insulation layer (G1) is then fabricated upon the S1 shield. A sensor structure is fabricated upon the G1 layer and located in a central read region of the head, while hard bias elements and electrical contact leads are fabricated and located in each of two side regions. The central sensor structure typically includes an antiferromagnetic pinning layer, ferromagnetic pinned layers, a nonmagnetic spacer layer, a ferromagnetic free layer, and a nonmagnetic cap layer. The hard bias element typically includes a seed layer and a magnetic hard bias layer. The electrical contact leads typically include a seed layer and an electrically conducting nonmagnetic lead layer. A second insulation layer (G2) followed by a second magnetic shield layer (S2) are subsequently fabricated.

A problem that has been recognized with regard to such prior art MR and GMR read heads is that the electrical leads must be thick enough to supply an adequate electrical current flow through the sensor; however, such thick electrical leads can create a rather severe step that must be covered by sufficient G2 insulation to prevent electrical shorting between the leads and the second magnetic shield S2 that is fabricated above the G2 insulation layer. It is therefore desirable to fabricate the sensor with thinner electrical leads which reduce the size of the step to avoid electrical shorting and which nevertheless conduct sufficient current to the sensor.

SUMMARY OF THE INVENTION

The present invention is an improved magnetic head for a hard disk drive including an electrical lead layer that is comprised of a material having an ordered-phase crystalline structure. In a preferred embodiment, the ordered-phase crystalline structure of the electrical lead is epitaxially matched to the crystalline structure of the hard bias layer upon which it is formed. In this embodiment, there is no need for a seed layer separate and distinct from the hard bias layer under the electrical leads.

Electrical leads comprised of the materials used in the invention having an ordered-phase crystalline structure, particularly a B2, $L1_0$, $L1_1$, and $L1_2$ structure, will have reduced resistivity over the prior art electrical leads that are typically composed of rhodium or tantalum. As a result, thinner electrical leads can be fabricated which carry the same, or even greater, current than the prior art rhodium or tantalum leads. The thinner electrical leads result in a reduced electrical lead step height, and thereby have reduced occurrence of electrical shorts in the manufactured magnetic heads, ultimately leading to improved yield of the manufacturing process.

The preferred leads of the present invention are comprised of NiAl having a B2 crystalline structure, and alternative embodiments include electrical leads that are comprised of CuAu, $Cu_3Au$, CuPt, $Cu_3Pt$, CuZn and FeCo.

It is an advantage of the magnetic heads of the present invention that it includes a thinner electrical lead.

It is another advantage of the magnetic head of the present invention that it includes an electrical lead having reduced resistivity.

It is another advantage of the magnetic head of the present invention that it includes an electrical lead having an ordered-phase crystalline structure.

It is a further advantage of the magnetic head of the present invention that it includes an electrical lead having an ordered-phase crystalline structure that is epitaxially matched to the crystalline structure of the hard bias layer upon which it is fabricated.

It is yet another advantage of the magnetic head of the present invention that the electrical leads can be fabricated without need of an electrical lead seed layer separate and distinct from the hard bias layer.

It is an advantage of the hard disk drive of the present invention that it includes a magnetic head of the present invention having a thinner electrical lead.

It is an advantage of the hard disk drive of the present invention that it includes an electrical lead having reduced resistivity.

It is an advantage of the hard disk drive of the present invention that it includes an electrical lead having an ordered-phase crystalline structure.

It is an advantage of the hard disk drive of the present invention that it includes an electrical lead having an ordered-phase crystalline structure that is epitaxially matched to the crystalline structure of the hard bias layer upon which it is fabricated.

It is an advantage of the method for fabricating a magnetic head of the present invention that it is fabricated utilizing electrical leads having a reduced thickness.

It is another advantage of the method for fabricating a magnetic head of the present invention that the fabrication of electrical leads does not require the deposition of a seed layer separate and distinct from the hard bias layer.

It is a further advantage of the method for fabricating a magnetic head of the present invention that it is fabricated with thinner electrical leads which reduce the incidence of electrical shorts, thereby increasing the yield of the fabrication process.

These and other features and advantages of the present invention will no doubt become apparent to those skilled in the art upon reading the following detailed description, which makes reference to the several figures of the drawings.

IN THE DRAWINGS

DETAILED DESCRIPTION OF THE PREFERRED EMBODIMENTS

Figure 1:
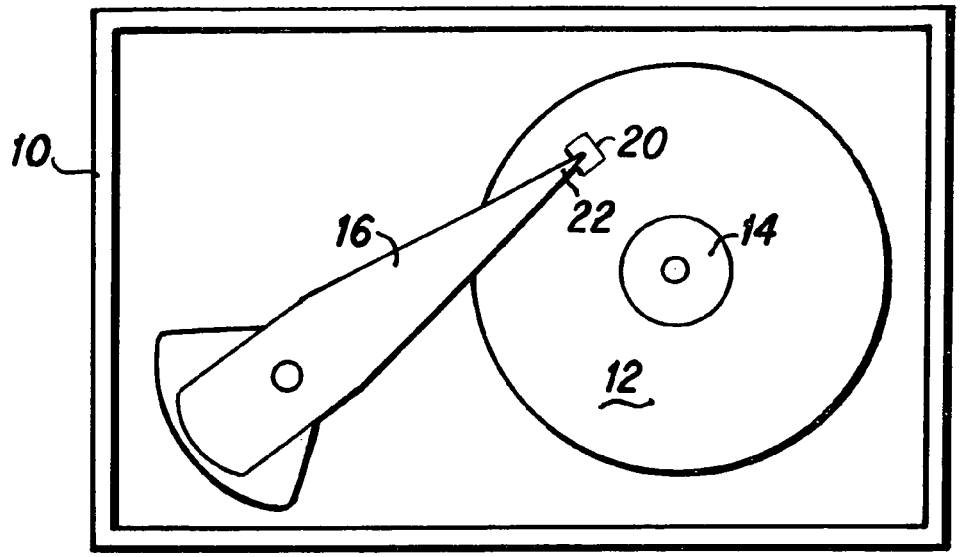
FIG. 1 is a top plan view depicting a hard disk drive having a magnetic head of the present invention.

FIG. 1 is a top plan view that depicts significant components of a hard disk drive which includes the magnetic head of the present invention. The hard disk drive 10 includes a magnetic media hard disk 12 that is rotatably mounted upon a motorized spindle 14. An actuator arm 16 is pivotally mounted within the hard disk drive 10 with a magnetic head 20 of the present invention disposed upon a distal end 22 of the actuator arm 16. A typical hard disk drive 10 may include a plurality of disks 12 that are rotatably mounted upon the spindle 14 and a plurality of actuator arms 16, each having a magnetic head 20 mounted upon the distal end 22 of the actuator arm. As is well known to those skilled in the art, when the hard disk drive 10 is operated, the hard disk 12 rotates upon the spindle 14 and the magnetic head 20 acts as an air bearing slider that is adapted for flying above the surface of the rotating disk. The slider includes a substrate base upon which the various layers and structures that form the magnetic head are fabricated. Such heads are fabricated in large quantities upon a wafer substrate and subsequently sliced into discrete magnetic heads 20.

Figure 2:
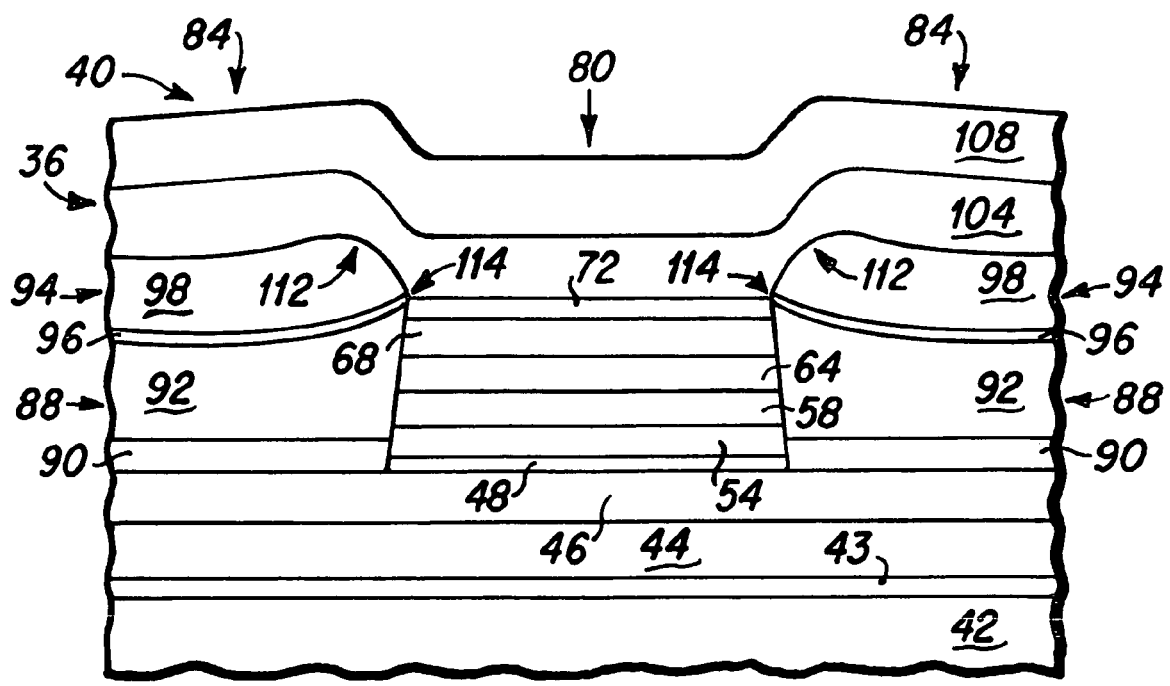
FIG. 2 is a side cross-sectional view of a prior art read head portion of a magnetic head.

FIG. 2 is a side cross-sectional view of a prior art giant magnetoresistive (GMR) read element 36 of a prior art magnetic head 40. As depicted therein, the prior art GMR read element 36 generally includes a substrate base 42 that constitutes the material upon which the magnetic head is fabricated, such as alumina/titanium carbide. An alumina underlayer 43 is deposited upon the substrate and a first magnetic shield S1 44 is fabricated on the underlayer 43. An insulation layer G1 46, typically composed of aluminum oxide, is then fabricated upon the S1 magnetic shield 44. A seed layer 48 is deposited upon the G1 insulation layer 46 and a series of thin film layers are sequentially deposited upon the seed layer 48 to form the GMR read head sensor. A variety of thin film layers are known in the prior art to fabricate such GMR sensors, and, for the purposes of the present invention the layers generally include an antiferromagnetic layer 54, a pinned magnetic layer 58 that is deposited upon the antiferromagnetic layer 54, a spacer layer 64 that is deposited upon the pinned magnetic layer 58, a free magnetic layer 68 that is deposited upon the spacer layer 64 and a cap layer 72 that is deposited upon the free magnetic layer 68. Typically, the antiferromagnetic layer 54 may be composed of PtMn, the pinned magnetic layer 58 may be composed of CoFe, the spacer layer 64 may be composed of Cu, the free magnetic layer 68 may be composed of NiFe and the cap layer 72 may be composed of Ta.

Following the deposition of the GMR sensor layers 54-72, a patterned etching or ion milling process is conducted in which a mask is fabricated over the central regions 80 of the layers 54-72 and the unmasked side regions 84 are exposed and removed, such that only central regions 80 of the layers 54-72 remain. Thereafter, hard bias elements 88 are deposited on each side of the central regions 80, including the deposition of a seed layer 90 and a hard bias layer 92 that is typically composed of a cobalt alloy material such as CoPtCr. Following the deposition of the hard bias elements 88, electrical contacts 94 are fabricated on top of the hard bias elements 88. The electrical contacts include a seed layer 96 that is deposited upon the hard bias layer 92 and electrical leads 98 that are fabricated upon the seed layer 96. The electrical leads 98 are typically composed of rhodium or tantalum. A second insulation layer G2 104 is then fabricated on top of the electrical leads 98 followed by the fabrication of a second magnetic shield layer S2 108 and further components that are well known to those skilled in the art for fabricating a complete magnetic head.

The GMR sensor has a read gap that is defined by the distance between the two magnetic shields 44 and 108 in which the sensor detects passing magnetic bits of the hard disk 12 of the disk drive 10. When the GMR sensor is more sensitive, the read gap can be reduced in size and the read element can read smaller data bits that are formed on the hard disk 12, such that the areal data storage density (bits per inch) of the hard disk can be increased. However, one of the significant factors in controlling the size of the read gap is the thickness of the G2 insulation layer 104. Particularly, a problem that exists with the prior art GMR sensor depicted in FIG. 2 is that the thickness of the electrical leads 98 creates a significant step 112 where the electrical lead 98 converges with the side edge 114 of the central portion of the sensor. Where such a step 112 exists, a thick G2 insulation layer must be deposited in order to be assured of insulation coverage at the step in order to prevent electrical shorting at the step location between the electrical lead 98 and the S2 magnetic shield 108. Such electrical shorting will render the GMR sensor inoperable. As is next described, the GMR sensor of the magnetic head of the present invention is fabricated with thinner electrical leads that result in a reduction in the step 112, resulting in improved performance characteristics of the magnetic head and hard disk drive.

Figure 3:
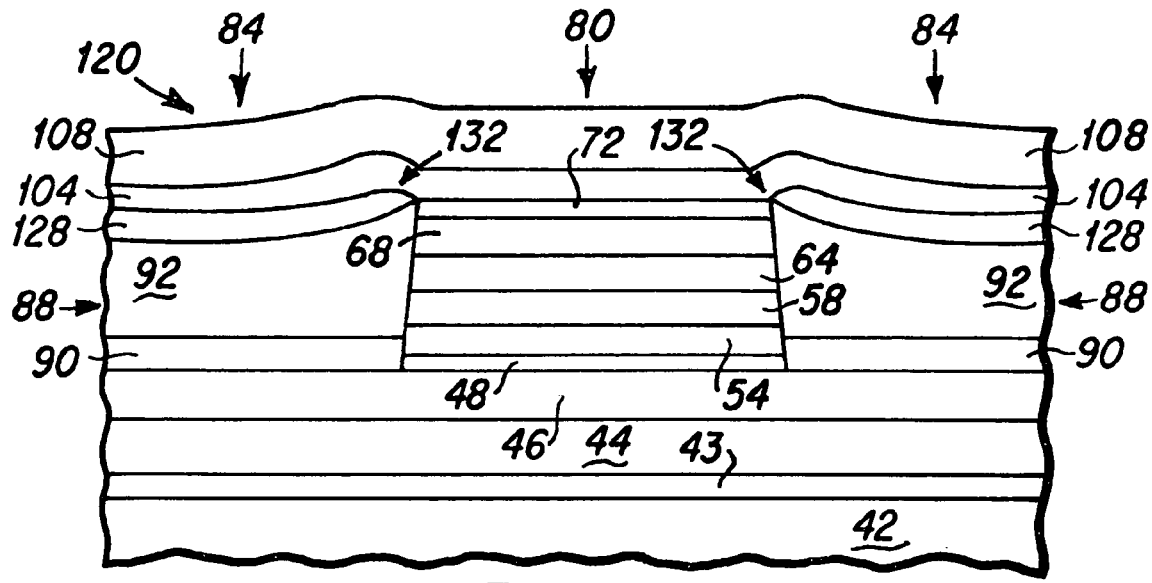
FIG. 3 is a side cross-sectional view of a first preferred embodiment of a read head portion of a magnetic head of the present invention.

The improved GMR sensor of the magnetic head of the present invention 120 is depicted in FIG. 3, wherein corresponding components to the prior art GMR sensor depicted in FIG. 2 are similarly numbered for ease of comprehension. As depicted in FIG. 3, the GMR sensor of the magnetic head 120 of the present invention includes a substrate base 42, an alumina underlayer 43, a first magnetic shield 44, an insulation layer 46, a seed layer 48, and GMR sensor layers that may generally include an antiferromagnetic layer 54, a pinned magnetic layer 58, a spacer layer 64, a free magnetic layer 68 and a cap layer 72. Hard bias elements 88 are fabricated on the sides of the centrally located GMR sensor layers, and they include a seed layer 90 and a hard bias layer 92 that is composed of a cobalt alloy, such as CoPtCr.

In contrast to the prior art sensor structure, the sensor of the magnetic head of the present invention is fabricated with electrical leads 128 having a different composition; particularly they that are composed of a material having an ordered-phase crystalline structure. An ordered-phase crystalline structure means that specific atomic species reside at specific atomic sites within the crystal structure. This is to be contrasted with an non-ordered-phase crystalline structure in which non-specific atomic species of an alloy reside randomly at the various atomic sites within a crystal structure. Advantageously, as compared to the prior art electrical leads 98 that are generally composed of rhodium or tantalum, the electrical leads 128 of the present invention, being composed of a material with an ordered-phase crystalline structure, have a lower resistivity. As a result, a thinner electrical lead 128 can be fabricated, which carries the same electrical current as the thicker prior art leads 98. The thinner electrical leads 128 of the present invention result in a reduced step size 132, thereby enabling the use of a thinner G2 insulation layer 104, because the problem of electrical shorting to the S2 magnetic shield 108 is significantly reduced. As a result, an improved magnetic head 120 is created in which the read gap is reduced because the thickness of the G2 insulation layer 104 has been reduced. Further details and particular embodiments of the present invention are next discussed.

Figure 4:
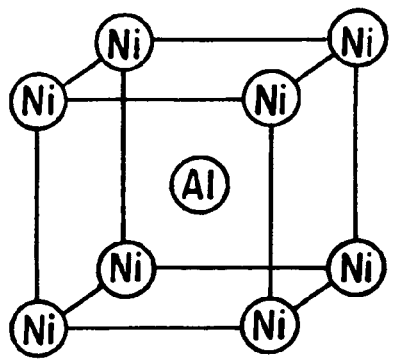
FIG. 4 depicts the B2 ordered-phase crystalline structure of NiAl.
Figure 5:
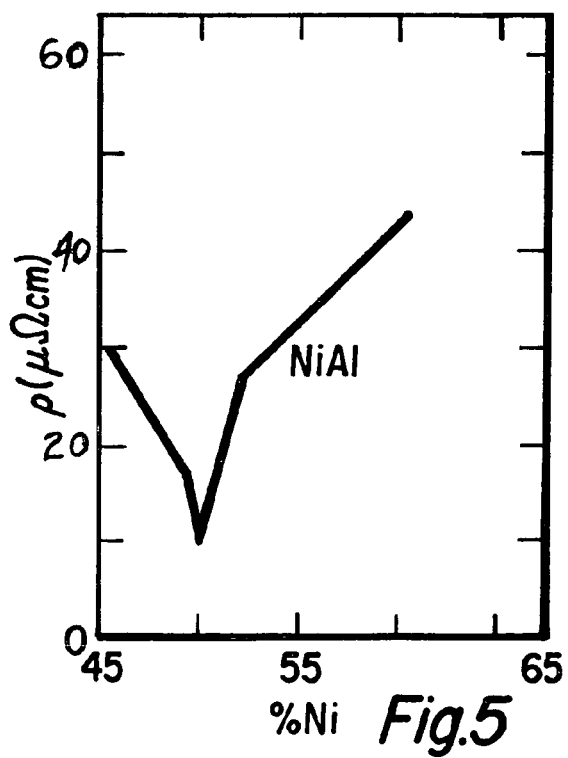
FIG. 5 is a graph depicting the change in resistivity of NiAl with the atomic percentage (a/o) nickel composition.

In a first embodiment of the magnetic head 120 of the present invention the electrical leads are comprised of β-NiAl having a B2 crystal structure, and such a crystal structure is depicted in FIG. 4. As is seen in FIG. 4, the β-NiAl structure is an ordered-phase crystalline structure, which can be described as having nickel atoms located at the cube corners and aluminum atoms centrally disposed at the cube centers within a cubic lattice of nickel atoms. The relative compositions of Ni and Al in the NiAl lead are important in achieving the B2 ordered-phase crystalline structure, and FIG. 5 is a graph of the resistivity of NiAl compositions at room temperature. It has been generally observed that ordered-phase intermetallic alloys have a lower resistivity than solid solutions consisting of alloys of the same composition, and as can be seen in FIG. 5, the resistivity of NiAl compositions varies with the percentages of Ni and Al. Specifically, a preferred NiAl electrical lead structure 120 of the present invention will desirably have a low resistivity, and it is seen that where the percent Ni is from approximately 45 atomic percent (a/o) to approximately 60 a/o, the resistivity is reduced as the B2 ordered-phase crystalline structure is formed in this range. Where the Ni concentration is preferably approximately 50 a/o the lowest resistivity is achieved, which is approximately ~8.0 µΩcm at 50 a/o Ni.

In comparing the NiAl electrical lead of the present invention (assuming 50 a/o Ni) with the tantalum leads of the prior art, the improvement of the present invention can be quantified in that the prior art tantalum leads have a bulk resistivity of approximately 12.4 µΩcm where the NiAl leads of the present invention have a bulk resistivity of approximately ~8.0 µΩcm. As a result, the NiAl electrical leads of the present invention can be fabricated with approximately ⅔ of the thickness of the prior art tantalum leads and still conduct the same quantity of electrical current through the sensor. Particularly, where the prior art tantalum leads are typically fabricated with a thickness of approximately 75 nm, the NiAl electrical leads of the magnetic head 120, can be fabricated with a thickness of approximately 50 nm. Alternatively, the thickness of the NiAl leads can be varied, such as by using a 75 nm thick NiAl lead layer which will have improved electrical current carrying capabilities over the prior art magnetic head, thereby increasing sensor signal values.

In comparing an alternative embodiment of the present invention using a CuAu electrical lead (assuming 50 a/o Cu) with the rhodium leads of the prior art, the improvement of the present invention can be quantified in that the prior art rhodium leads have a bulk resistivity of approximately 4.3 µΩcm where the CuAu leads of the present invention have a bulk resistivity of approximately 3.5 µΩcm. As a result, the CuAu electrical leads of the present invention can be fabricated with approximately ⅘ of the thickness of the prior art rhodium leads and still conduct the same quantity of electrical current through the sensor. Particularly, where the prior art rhodium leads are typically fabricated with a thickness of approximately 25 µm, the CuAu electrical leads of the magnetic head 120, can be fabricated with a thickness of approximately 20 nm. Of course, the thickness of the CuAu leads can be varied, such as by using a 25 nm thick CuAu lead layer which will have improved electrical current carrying capabilities over the prior art magnetic head, thereby increasing sensor signal values. Similar arguments apply for the use $Cu_3Au$ with a bulk resistivity of approximately 3.9 µΩcm.

An additional feature that results from the fabrication of NiAl, FeCo, or CuZn leads 128 above a cobalt alloy hard bias layer 92 (such as CoPtCr) is that the crystalline structure of the cobalt alloy hard bias layer acts as a growth template and epitaxially aligns the NiAl, FeCo, or CuZn crystals in the leads with those of the hard bias layer. As a result, where the NiAl, FeCo, or CuZn leads 128 are fabricated above such cobalt alloy hard bias layers 92, there is no need to deposit a seed layer (such as prior art seed layer 96). Rather, the epitaxial matching of the cobalt alloy structure with the NiAl, FeCo, or CuZn structure facilitates the formation of a lead structure having a large grain size in the ordered B2 phase. A larger grain size further reduces the resistivity of the lead layer allowing for a thinner lead and hard/bias lead structure without an intervening seed layer for the lead layer. Thus, the epitaxially matched hard bias/lead layer structure contributes to the low resistivity of the electrical leads, further reduces the size of the step 132 as no electrical lead seed layer is required, and improves the performance of the magnetic head.

It is desirable that the hard bias layer be composed a cobalt alloy, such as CoPtCr, or CoPt with a composition selected to epitaxially match atomic sites across the interface with the ordered-phase B2 structures of NiAl, FeCo, or CuZn. The matching of atomic sites is determined by the lattice parameters of the two structures on either side of the interface; NiAl, FeCo, or CuZn have latice parameters of 0.288 nm, 0.285 nm, and 0.295 nm, respectively; and, cobalt, which is representative of the Co alloys, has HCP (hexagonal close packed) lattice parameters of a=0.251 nm, and c=0.407 nm. A preferred hard bias layer composition is $Co_{82}Pt_{10}Cr_8$ that closely matches the lattice sites in NiAl or FeCo for the orientation relationship in which (001) planes of the B2 structure are parallel to (11$\bar{2}$0) planes of the HCP Co or a suitable HCP Co alloy. As in known in the art, a Co-based hard bias layer is deposited on a seed layer, preferably Cr or an alloy of Cr, that favors the hard bias layer preferentially having the c-axes of its HCP crystals oriented in the plane of the film, or parallel to the substrate. With the (11$\bar{2}$0) planes of the HCP structure made parallel to the substrate, a c-axis in-plane orientation is obtained that orients the hard axis of magnetization, the direction of high magnetic anisotropy, i.e. the c-axis, in the plane of the sensor film structure, imparting greater magnetic stability to the sensor. The preceding is not meant to limit the invention only to the use of those (11$\bar{2}$0) oriented hard bias films, as other c-axis in-plane orientations of Co or Co alloys are possible that favor the epitaxial growth of lead materials such as NiAl or FeCo with the B2 structure. Even more generally, the c-axis of the hard bias layer need not be directed in the plane of the substrate to obtain good epitaxial matching between the NiAl and FeCo because such matching is determined primarily by lattice parameters of the respective layers.

With regard to the fabrication of the NiAl, FeCo, or CuZn leads, it is preferred that they be deposited by ion beam deposition. In the case of NiAl, a preferred target composition is a $Ni_xAl_{1-x}$ target having a composition where x is between 0.46 and 0.50. Where the NiAl, FeCo, or CuZn leads are deposited using ion beam deposition, they have a still larger grain size and an improved ordered-phase crystalline structure, resulting in lower resistivity. Another benefit of the fabrication of the magnetic heads using NiAl, FeCo, or CuZn leads is that the use of such leads results in substantial cost savings because sputtering targets made from these materials are considerably less expensive than the currently used prior art rhodium material targets. Additionally, the present invention has secondary cost benefits beyond those associated with the cost of targets alone through the reduction of process deposition steps required for the prior art electrical lead seed layer 96, and the improved yields associated with fewer electrical shorts between the S2 shield and the electrical lead 128 due to the reduction in the size of the electrical lead step 132.

NiAl, and FeCo, are preferred over CuZn because of the relatively high vapor pressure of Zn which gives rise to difficulties in maintaining the low pressure, i.e. high vacuum, required by thin-film vacuum deposition processes for lead fabrication when Zn or Zn alloy deposition is involved. Moreover, FeCo, itself being a magnetic material, may allow for the use of a yet overall thinner combined hard bias/lead structure because the FeCo itself can provide a contribution to the net magnetic moment of the combined hard bias/lead structure. Since the moment of the hard bias CoPtCr layer is proportional to its thickness, the thickness of the hard bias layer can be reduced because the thickness of the FeCo contributes to the net magnetic moment of the combined hard bias/lead structure. However, the relative magnetic softness, i.e. lower coercivity, of FeCo compared with CoPtCr presents a trade-off with respect to maintaining a high coercivity of the combined hard bias/lead structure required to maintain a single domain state in the free layer of the GMR sensor. It is well known in the art that bilayers composed of a hard magnetic material, i.e. one having high coercivity, and a soft magnetic material, i.e. one having a lower coercivity, behave magnetically as a single magnetic layer with a coercivity that is somewhere in between the coercivities of either layer alone. Therefore, it is expected that there is some optimum thickness for each of the layers that results in the best combination of the resulting overall thickness of the combined hard bias/lead structure, low lead resistivity, combined high hard bias/lead coercivity, and combined hard bias/lead magnetic moment.

While a preferred embodiment of the present invention includes the NiAl or FeCo lead layer having a B2 ordered-phase crystalline structure, the electrical leads of alternative embodiments of the present invention can be fabricated with other particular ordered-phase crystalline structures of other alloy compositions. Specifically, reduced resistivity of ordered-phase crystalline structures can be found in ordered-phase structures selected from the group consisting of $L1_0$, $L1_1$, and $L1_2$. Particular alloy compositions of these ordered-phase crystal structures are CuAu and CuPt having an $L1_0$ and $L1_1$, structures, respectively, and $Cu_3Au$ and $Cu_3Pt$ both having an $L1_2$ structure. Furthermore, the compositions, CuAu and $Cu_3Au$, in their ordered-phase crystalline structures possess reduced resistivity in bulk, viz. 3.48 $\mu\Omega cm$ and 3.91 $\mu\Omega cm$, respectively, as compared with that of rhodium, 4.33 $\mu\Omega cm$, of the prior art. Also, the further compositions, CuPt and $Cu_3Pt$, in their ordered-phase crystalline structures possess reduced resistivity in bulk, namely, ~9 $\mu\Omega cm$ and ~11 $\mu\Omega cm$, respectively, as compared with that of tantalum, 12.4 $\mu\Omega cm$, of the prior art. The ordered-phase crystalline structure of these materials is more difficult to attain, and the use of slow deposition rates and thermal annealing in the formation of the lead structures utilizing these materials will aid in the creation of the desired ordered-phase crystalline structure of these lead materials.

Another benefit of the fabrication of the magnetic heads using CuAu or $Cu_3Au$ leads is that the use of CuAu or $Cu_3Au$ leads will result in substantial cost savings due to the use of a CuAu or $Cu_3Au$ alloy target, which is about half as expensive as the currently used prior art rhodium material targets.

It is therefore to be understood that a significant feature of the present invention is the fabrication of the electrical leads from a bimetal alloy having an ordered-phase crystalline structure that has a low resistivity. Either FeCo, or CuZn are desirable choices because they have a B2 structure having a resistivity of approximately 5.6 $\mu\Omega cm$, and 5.3 $\mu\Omega cm$ in bulk for approximately 50 a/o Fe and approximately 50 a/o Cu, respectively. Likewise, as it has been generally observed that ordered-phase intermetallic alloys have a lower resistivity than solid solutions consisting of alloys of the same composition, FeCo and CuZn show a similar behavior to that shown in FIG. 5 for the resistivity of NiAl compositions varying with the percentages of constituents, making up the B2 ordered-phase. Specifically, a preferred FeCo electrical lead structure 120 of the present invention will desirably have a low resistivity, and where the percent Fe is from approximately 40 a/o to approximately 60 a/o, the resistivity is reduced as the B2 ordered-phase crystalline structure is formed in this range. Similarly, a preferred CuZn electrical lead structure 120 of the present invention will desirably have a low resistivity, and where the percent Cu is from approximately 55 a/o to approximately 50 a/o, the resistivity is reduced as the B2 ordered-phase crystalline structure is formed in this range. Where the Fe concentration is preferably approximately 50 a/o and the Cu concentration is preferably approximately 50 a/o, the lowest resistivity is achieved for the FeCo and CuZn alloys, respectively.

Due to low resistivity, the thickness of the FeCo, or CuZn lead layer can be substantially reduced over the prior art thickness of tantalum leads and adequate electrical current will still flow through the sensor layers. Additionally, the B2 structure of FeCo, or CuZn is epitaxially matched to the cobalt alloy (such as CoPtCr) of the hard bias layer, and there is no need for a seed layer which advantageously further reduces the thickness of the hard bias/lead structure. As a result, the size of the electrical lead step 132 over the prior art step 112 is reduced, leading to a reduction in the thickness of the G2 insulation layer and a corresponding reduction in the read gap of the magnetic head of the present invention. Both FeCo, or CuZn with the B2 structure are inexpensive, and have low resistivity. Since CuZn presents some difficulties for vacuum deposition due to the high vapor pressure of Zn, FeCo is to be preferred being a magnetic material that has high magnetic moment useful in further optimization of the overall magnetic properties of the combined hard bias/lead structure.

Thus, the present invention is intended to apply to various types and configurations of GMR read heads that may include various numbers and types of thin film layers to provide improved read bead characteristics. Therefore, while the present invention has been shown and described with regard to certain preferred embodiments, it will be understood that those skilled in the art will no doubt develop certain alterations and modifications thereto which nevertheless include the true spirit and scope of the invention. It is therefore intended that the following claims cover all such alterations and modifications.

What we claim is:

1. A magnetic head having a magnetoresistive sensor, comprising:
   a plurality of sensor layers;
   a hard bias/lead structure being disposed at side areas of said sensor layers, said hard bias/lead structure including an electrical lead layer having an ordered-phase crystalline structure; and
   wherein said electrical lead layer is comprised of a material selected from the group consisting of CuZn, FeCo, CuPt and $Cu_3Pt$.

2. A magnetic head as described in claim 1 wherein said hard bias/lead structure includes a hard bias layer having a crystalline structure, and wherein said ordered-phase crystalline structure of said electrical lead layer is epitaxially matched to said crystalline structure of said hard bias layer.

3. A magnetic head as described in claim 2 wherein said lead layer is formed with a B2 structure comprised of an alloy selected from the group consisting of CuZn and FeCo.

4. A magnetic head as described in claim 3 wherein said lead layer is comprised of an alloy of CuZn, wherein the Cu composition ranges from approximately 55 a/o to approximately 50 a/o.

5. A magnetic head as described in claim 4 wherein said Cu composition is approximately 50 a/o.

6. A magnetic head as described in claim 3 wherein said lead layer is comprised of an alloy of FeCo, wherein the Fe composition ranges from approximately 40 a/o to approximately 60 a/o.

7. A magnetic head as described in claim 6 wherein said Fe composition is approximately 50 a/o.

8. A magnetic head as described in claim 1 wherein said hard bias/lead structure includes a hard bias layer that is comprised of a cobalt alloy, and an electrical lead layer that is comprised of an alloy selected from the group consisting of CuZn and FeCo that is deposited directly upon said hard bias layer.

9. A hard disk drive including a magnetic head having a magnetoresistive sensor, comprising:

a plurality of sensor layers;

a hard bias/lead structure being disposed at side areas of said sensor layers, said hard bias/lead structure including a hard bias layer and electrical lead layer having an ordered-phase crystalline structure; and wherein said electrical lead layer is comprised of a material selected from the group consisting of CuZn, FeCo, CuPt and $Cu_3Pt$.

10. A hard disk drive as described in claim 9 wherein said hard bias layer has a crystalline structure, and wherein said ordered-phase crystalline structure of said electrical lead layer is epitaxially matched to said crystalline structure of said hard bias layer.

11. A hard disk drive as described in claim 10 wherein said lead layer is formed with a B2 structure comprised of an alloy selected from the group consisting of CuZn and FeCo.

12. A hard disk drive as described in claim 10 wherein said lead layer is comprised of an alloy of CuZn, wherein the Cu composition ranges from approximately 55 a/o to approximately 50 a/o.

13. A hard disk drive as described in claim 10 wherein said lead layer is comprised of an alloy of FeCo, wherein the Fe composition ranges from approximately 40 a/o to approximately 60 a/o.

14. A hard disk drive as described in claim 9 wherein said hard bias layer is comprised of a cobalt alloy, and said electrical lead layer is comprised of an alloy selected from the group consisting of CuZn and FeCo and is deposited directly upon said hard bias layer.

* * * * *